United States Patent
Hwang

(10) Patent No.: US 6,256,065 B1
(45) Date of Patent: Jul. 3, 2001

(54) SOLID STATE IMAGE PICKUP DEVICE

(75) Inventor: Il Nam Hwang, Seoul (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 0 days.

(21) Appl. No.: 09/012,226

(22) Filed: Jan. 23, 1998

(30) Foreign Application Priority Data

Jan. 25, 1997 (KR) .................................................... 97-2175

(51) Int. Cl.[7] ......................................................... H04N 3/14
(52) U.S. Cl. .............................................................. 348/314
(58) Field of Search .................................. 348/207, 311, 348/314, 315, 316, 317, 318, 319, 320, 321; 357/222, 223; H04N 5/335

(56) References Cited

U.S. PATENT DOCUMENTS

| | | | |
|---|---|---|---|
| 5,057,926 | * 10/1991 | Watanabe | 348/311 |
| 5,194,751 | * 3/1993 | Yonemoto et al. | 348/315 |
| 5,902,995 | * 5/1999 | Morimoto | 348/314 |
| 6,097,433 | * 8/2000 | Kawai et al. | 348/315 |

* cited by examiner

*Primary Examiner*—Tuan Ho

(57) ABSTRACT

Solid state image pickup device in which a horizontal charge coupled device (HCCD) region is divided into multi-channels so as to improve efficiency of charge-transferring and to widen its dynamic range is disclosed, including a plurality of photoelectric conversion regions; vertical charge coupled device (VCCD) regions for transferring in a vertical direction image charge generated in the photoelectric conversion regions; horizontal charge coupled device (HCCD) regions for dividing the image charge into one channel or two channel according to a level of the image charge transferred in a vertical direction and for transferring it in a horizontal direction; and a floating diffusion region for sensing only the image charge transferred through any one of the channels of the HCCD regions and draining the image charge transferred through the other channel without sensing it.

9 Claims, 7 Drawing Sheets

F I G.2b
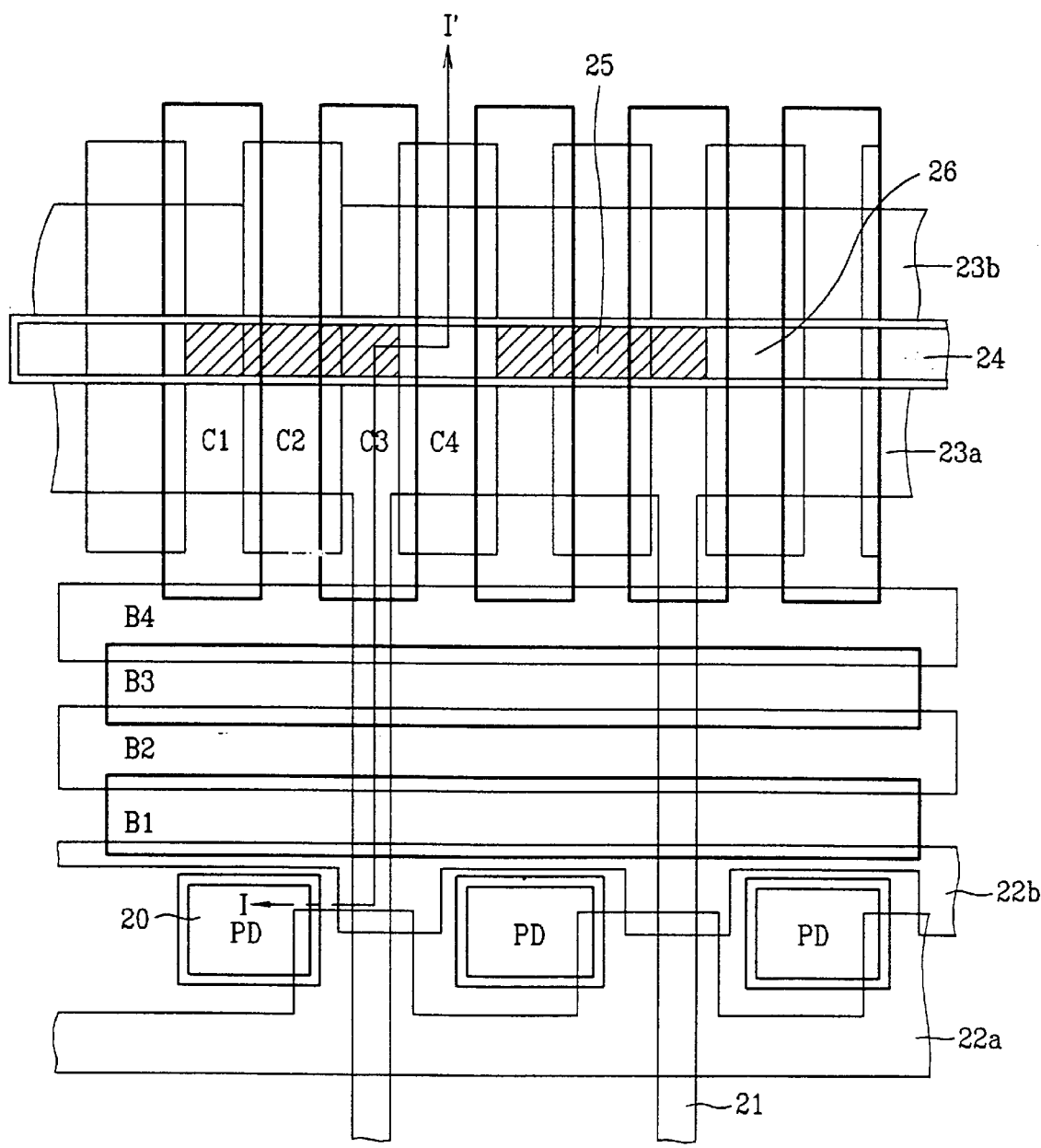

<Incident light of low intensity of illumination>

<Incident light of middle intensity of illumination>

<Incident light of high intensity of illumination>

FIG. 5a H1 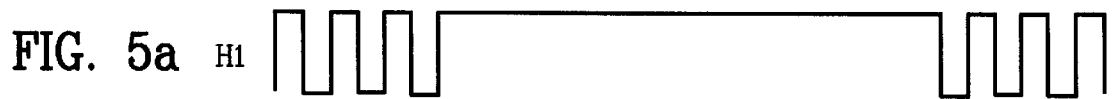
FIG. 5b H2 
FIG. 5c V1 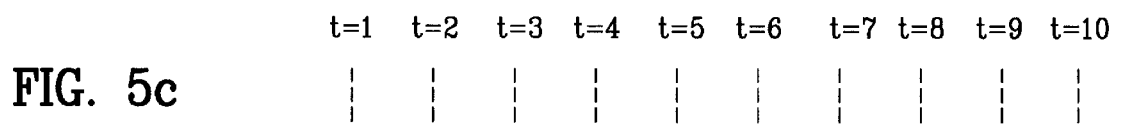
FIG. 5d V2 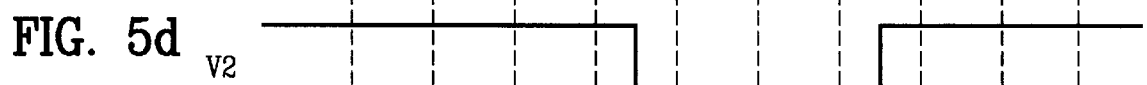
FIG. 5e V3 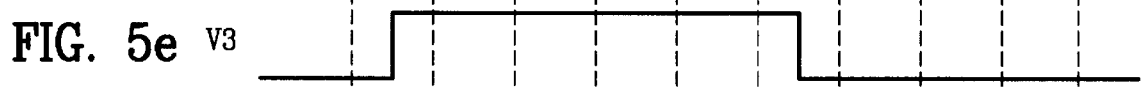
FIG. 5f V4 
FIG. 5g barrier gate 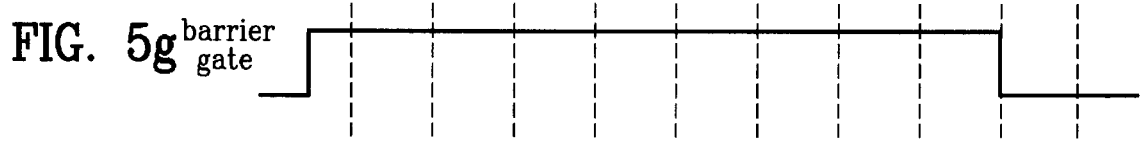

FIG. 5h  t=1  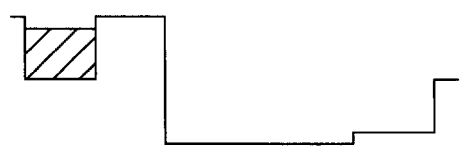
FIG. 5i  t=2  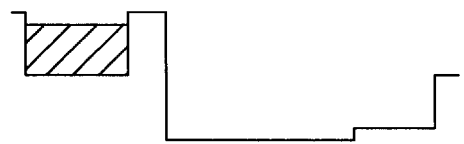
FIG. 5j  t=3  
FIG. 5k  t=4  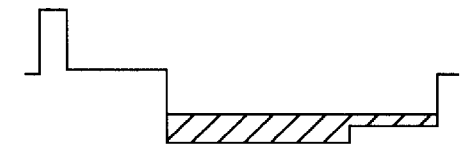
FIG. 5l  t=5  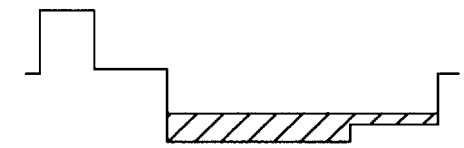
FIG. 5m  t=6  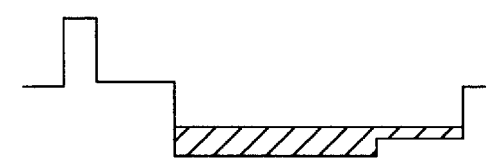
FIG. 5n  t=7  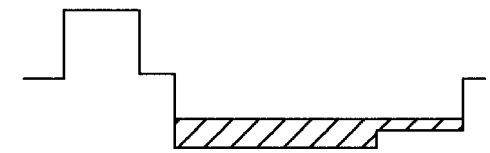
FIG. 5o  t=8  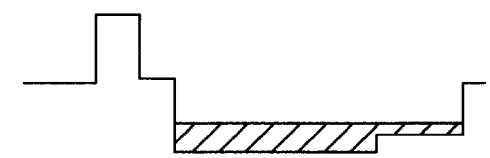
FIG. 5p  t=9  
FIG. 5q  t=10  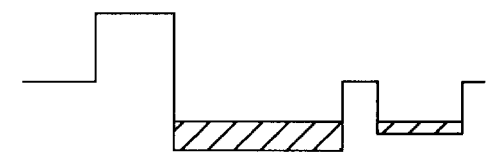

SOLID STATE IMAGE PICKUP DEVICE

BACKGROUND OF THE INVENTION

1. Field of the Invention

The present invention relates to a solid state image pickup device using a charge coupled device (CCD) and, more particularly, to a solid state image pickup device in which a horizontal charge coupled device (HCCD) region is divided into multi-channels so as to improve efficiency of charge-transferring and to widen its dynamic range.

2. Discussion of the Related Art

Utilizing photoelectric conversion devices and CCDs, a general solid state image pickup device pictures a subject and outputs it into an electric signal. A charge coupled device (CCD) transfers signal charge generated in the photoelectric conversion device such as a photo diode, in a specific direction by using potential change in a substrate.

A general solid state image pickup device includes a plurality of photoelectric conversion regions such as photo diodes (PD), a vertical charge coupled device (VCCD) region formed between the plurality of photoelectric conversion regions, and transferring charge generated in the photoelectric conversion regions in a vertical direction; a horizontal charge coupled device (HCCD) region transferring the charge that is transferred from the VCCD region in the vertical direction, in a horizontal direction, and a floating diffusion region sensing and amplifying the charge transferred in the horizontal direction and outputting it to a periphery circuit.

A conventional solid state image pickup device will be explained with reference to the accompanying drawings.

FIG. 1a shows the interface of the a VCCD region and a HCCD region of a general solid state image pickup device.

A general solid state image pickup device includes a plurality of photoelectric conversion regions 1 for converting an image signal of light into an electrical signal; VCCD regions 2 formed between the photoelectric conversion regions 1 transferring in a vertical direction the image charge generated in the photoelectric conversion regions 1; first and second poly gates 3a and 3b repeatedly formed on the VCCD regions 2; and HCCD regions 4 transferring in a horizontal direction the image charge transferred from the VCCD regions 2.

At an interface of the VCCD and HCCD regions 2 and 4, the first and second poly gates 3a and 3b, which clocks of B1, B2, B3, and B4 are applied alternately to, are repeatedly formed. On the HCCD regions 4, the first and second poly gates 3a and 3b, which clocks of C1, C2, C3, and C4 are applied alternately to, are repeatedly formed. In an end stage of the HCCD regions 4, there is located a sensing amplifier 5 which senses and amplifies the image charge transferred and finally outputs it to a periphery circuit. That is, the image charge that had been generated in the photoelectric conversion regions 1 and then was transferred through the VCCD and HCCD regions 2 and 4, is outputted to the periphery circuit by means of the sensing amplifier 5. This image signal outputted to the periphery circuit goes through various signal-processing steps. The level of the image signal that has gone through such steps depends on charge-generating and accumulating abilities of the photoelectric conversion regions 1, as well as on charge-transferring abilities of the VCCD and HCCD regions 2 and 4 and charge-sensing abilities of the amplifier 5. However, the level of the image signal is not outputted as it is. Having get through the diverse signal-processing steps, it is outputted in limits of levels of an image display device of a television or the like. In levels of image signal of a television, the difference between a peak value of a synchronizing signal and a value of a luminance signal is 1.0 Vp-p. At this time, a luminance signal is limited within 714 mV, and a signal of more than 714 mV is clipped. In other words, even though signal charge generated in the photoelectric conversion regions 1 is more than 714 mV, it goes through the signal-processing steps so that it is clipped to 714 mV, thereby having a signal level of as high as 714 mV. Therefore, it looks an identical image with that of a signal level of as high as 714 mV.

In the image signal-processing steps, gamma correction reduces signal levels of more than 700 mV, thus enabling signal levels of up to 1300 mV to be displayed.

FIG. 1b depicts two conventional transfer functions. The first conventional transfer function is depicted by the dashed line 10 and represents the relationship between the photodiodes and the CCD as a whole, i.e., the photodiode voltage as the input and the CCD voltage as the output. The straight dashed line 10 indicates that the CCD transfers the photodiode voltage without attenuation.

The second conventional transfer function of FIG. 1b is depicted by the solid line 12. It represents the relationship between the CCD voltage and the voltage after the conventional image processing. Up to 714 mV, the image processing preserves the CCD voltage without attenuation. Above an input level of 714 mV, however, the image processing maps the CCD output voltage level as 714 mV, i.e., it forces the CCD voltage level to be no more than 714 mV. This results in a loss of detail concerning bright objects. On a monitor, this appears to the viewer as washout of a bright object.

A conventional solid state image pickup device, in which a dynamic range of image signals is adjusted during signal-processing in a periphery circuit, so as to output them into a screen display device of a television, has the following problem. Although a signal charge generated in a photoelectric conversion region is more than 714 mV, it is clipped to 714 mV by going through signal-processing steps, thereby looking like an identical image with a signal of 714 mV. There is increased only a screen seize rate of an image in a saturate state.

SUMMARY OF THE INVENTION

Therefore, the present invention is directed to a solid state image pickup device that substantially obviates one or more of problems due to limitations and disadvantages of the related art.

An object of the invention is to provide a solid state image pickup device in which, according to an amount of incident light, an image charge of high illuminance is cut off by a predetermined rate so as to be outputted, and one of middle or low illuminance is to be outputted as it is, thereby widening a dynamic range.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the solid image pickup device in which, according to a level of an amount of incident light, a horizontal charge coupled device (HCCD) region is divided into multi-channels so as to output image charge by reducing the image charge or as it is, in order not to clip the image charge at all includes a plurality of photoelectric conversion regions; VCCD regions for transferring in a vertical direction image charge generated in the photoelectric conversion regions; HCCD regions for dividing the image charge into one channel or two channel according to a level of the image charge transferred in a vertical direction and for transferring it in a horizontal direction; and a floating diffusion region for sensing only the image charge transferred through any one of the channels of the HCCD regions and draining the image charge transferred through the other channel without sensing it.

It is to be understood that both the foregoing general description and the following detailed description are exemplary and explanatory and are intended to provide further explanation of the invention as claimed.

BRIEF DESCRIPTION OF THE DRAWINGS

These and various other objects, features, and advantages of the present invention will be readily understood with reference to the following detailed description read in conjunction with the accompanying drawings, in which:

FIG. 2b is a layout of an output stage of a solid state image pickup device according to the invention;

FIGS. 5a to 5g are clock timing diagrams of a charge-transfer operation; and

FIGS. 5h to 5q depict potential profiles corresponding to the clock timings of FIGS. 5a to 5g.

DETAILED DESCRIPTION OF THE PREFERRED EMBODIMENTS

Reference will now be made in detail to the preferred embodiments of the present invention, examples of which are illustrated in the accompanying drawings.

Figure 2A:
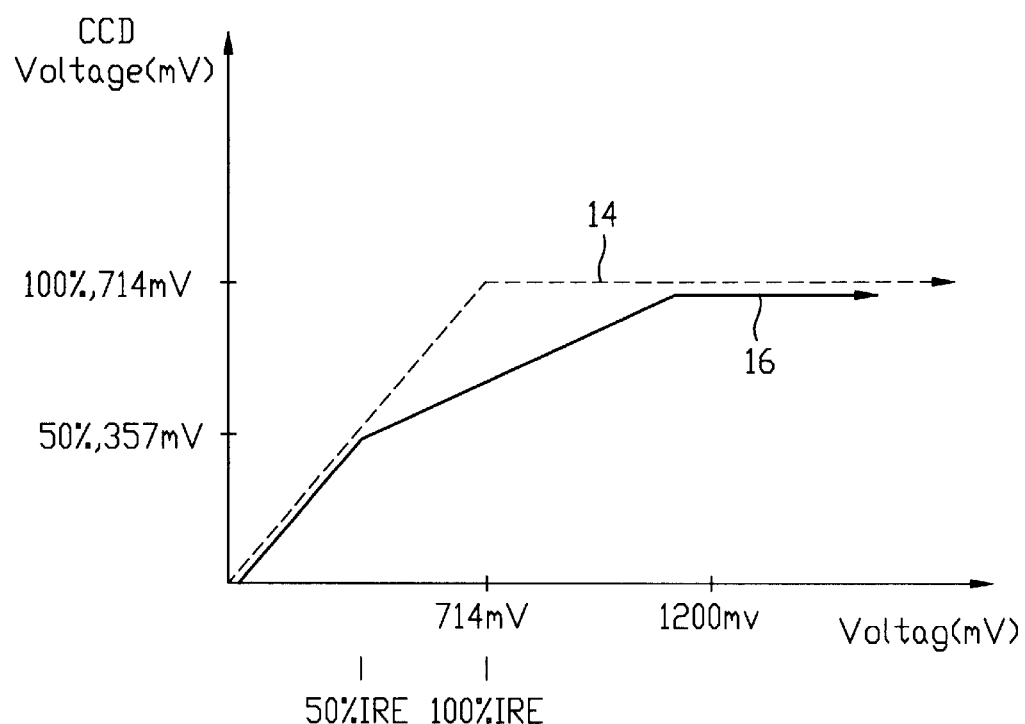
FIG. 2a is a plot of a transfer function according to the present invention, and a conventional transfer function for comparison.

FIG. 2a is a plot of conventional transfer function according to the present invention, and a conventional transfer function for comparison, and FIG. 2b is a layout of an output stage of a solid state image pickup device according to the invention.

A solid state image pickup device includes a plurality of photoelectric conversion regions 20 for converting an image signal into an electrical signal; VCCD regions 21 formed between the photoelectric conversion regions 20 and transferring in a vertical direction image charge generated in the photoelectric conversion regions; first and second poly gates 22a and 22b repeatedly formed on the VCCD regions 21; and first and second HCCD regions 23a and 23b for transferring in a horizontal direction the image charge transferred through the VCCD regions 21.

At this time, ion-implanting processes for the first and second HCCD regions 23a and 23b to have different potentials are performed in different conditions.

A barrier ions are implanted into the first and second HCCD regions 22a and 22b under the first poly gate 22a (or the second polygate 22b) for activating the transfer operation of charge. Although a signal of an identical level is applied to the first and second polygates 22a and 22b by the two-phase clocking, difference between the potential levels of the first and second HCCD regions 23a and 23b is made in order to activate the move of the charge.

At an interface region of the first and second HCCD regions 23a and 23b and the VCCD regions 21, the first and second poly gates 22a and 22b (which clocks of B1, B2, B3, and B4 are applied alternately to) are formed repeatedly. On the first and second HCCD regions 23a and 23b, the first and second poly gates 22a and 22b, which clocks of C1, C2, C3, and C4 are applied alternately to, are repeatedly formed, and a barrier gate 24 is formed in a direction of the HCCD regions so that the HCCD region are divided into multi-channels.

Under the barrier gate 24, a channel stop region 25 is formed in order that the image charge transferred into the second HCCD region 23b may not return to the first HCCD region 23a. A channel region 26 is formed under a portion of the barrier gate 24 which the channel stop region 25 is not formed, so as to move the charge from the first HCCD region 23a to the second HCCD region 23b. In an end stage of the first and second HCCD regions 23a and 23b, there is formed a floating diffusion region for sensing and amplifying the image charge, so that the image charge is outputted to a periphery circuit. At this time, a barrier layer is reversely formed to be capable for reversing the functions of the two first and second HCCD regions 23a and 23b.

The potential profile of the solid state image pickup device will be described below. The potential profile is in this order: first HCCD<second HCCD=channel region under barrier gate<channel stop layer under barrier gate. If a clock signal of low is applied to the barrier gate 24, the potential profile is in the order: first HCCD<second HCCD<channel region under barrier gate<channel stop layer under barrier gate.

A vertical structure of the solid state image pickup device of the invention will be explained in details.

Figure 3:
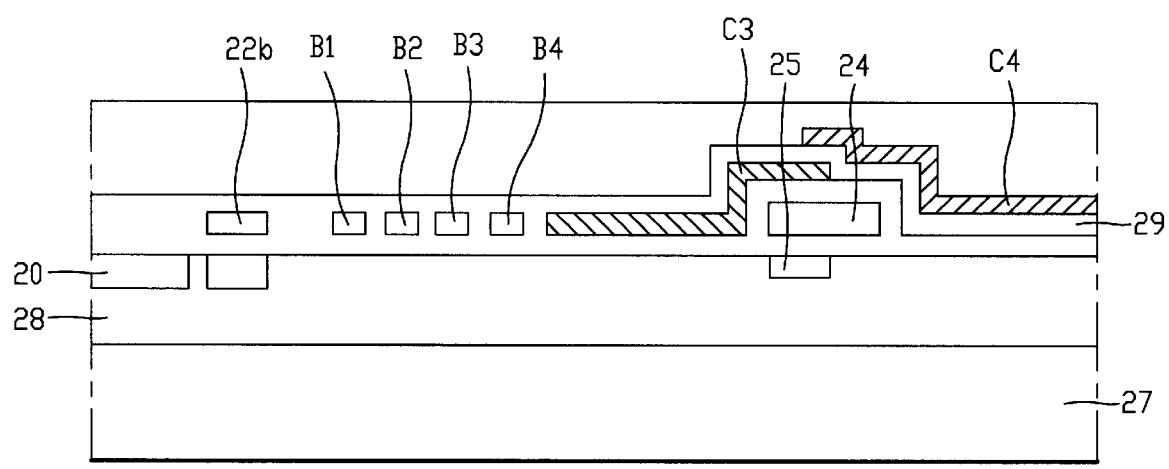
FIG. 3 is a cross-sectional view of FIG. 2b, taken along line I–I' of FIG. 2b.

FIG. 3 is a cross-sectional view of FIG. 2b taken along line I–I' of FIG. 2b.

A solid state image pickup device of the vertical structure includes a buried charge coupled device (BCCD) region 28 (including a VCCD 21 and the first and second HCCD regions 23a and 23b) formed in a p type well 27 of a semiconductor substrate; first and second poly gates 22a and 22b insulated from one another by insulating layers 29 and photoelectric conversion regions 20 and formed on the BCCD regions 28; and a barrier gate 24 formed under the first and second poly gates 22a and 22b formed on the first and second HCCD regions 23a and 23b.

At this time, any one of the first and second poly gates 22a and 22b formed in the VCCD region 21 is formed to partially overlap with the photoelectric conversion region 20.

In the solid state image pickup device, the operation for transmitting change will be explained below.

Figure 4:
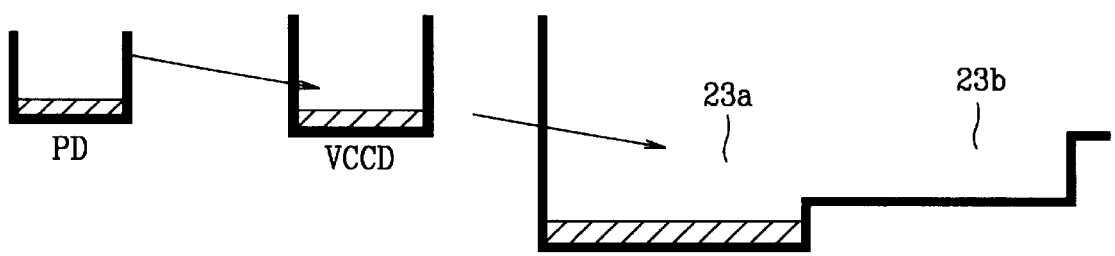
FIGS. 4a to 4c profiles depicting charge-transfer according to an amount of incident light.
Figure 4:
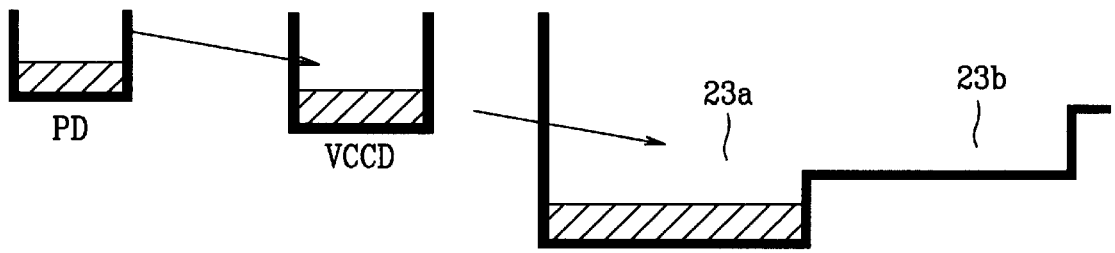
Figure 4:
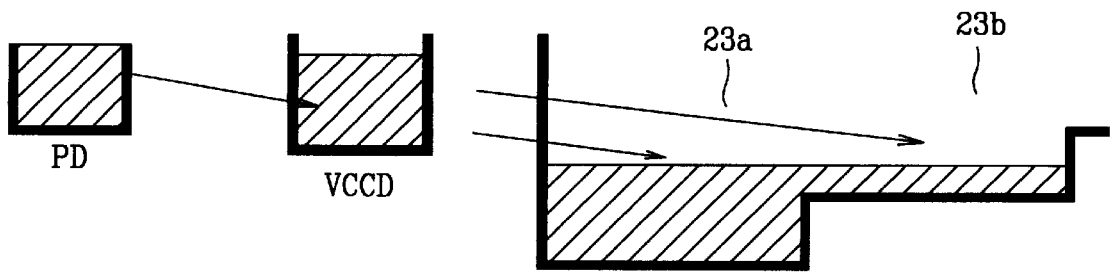

As shown in FIGS. 4a to 4c showing charge-transferring profiles according to an amount of indent light, when lights of low and middle intensities of light are incident upon the photoelectric conversion region 20, the generated charge is outputted to the floating diffusion region through the first HCCD region 23a. That is, it is not transferred to the second HCCD region 23b, but is transferred through the first HCCD region 23a.

In the other hand, if the light of a high intensity of illumination is incident upon the photoelectric conversion region 20, the charge transferred to the first HCCD region 23a through the VCCD region 21, except a predetermined amount of the charge left in the first HCCD region 23a, is transmitted to the second HCCD region 23b. Then, it is transmitted to the floating diffusion region through the second HCCD region 23b and then is drained to a reset drain region without sensing.

More details of the operation for transmitting charge will be explained below.

FIGS. 5a to 5g are a clock timing diagram of charge-transferring operation and FIGS. 5h to 5q are potential profiles corresponding to the clock timings.

When t is from 1 to 9, a clock of high has been applied to the barrier gate 24, such that a barrier is not formed in the HCCD region. That is, the charge generated in the photoelectric conversion region 20 is in the HCCD region through the VCCD region 21. When the charge transmitted to the HCCD region has a low value (a low intensity and a middle intensity of illumination) due to a potential difference between the first and second HCCD regions 23a and 23b, it fills the first HCCD region 23a alone. When it has a high value (a high intensity of illumination), a predetermined portion of it fills the first HCCD region 23a and the rest of it moves to the second HCCD region 23b. In such a state, a clock of low is applied to the barrier gate 24, a barrier is formed at the center of the HCCD region, thus dividing the HCCD region into two channels.

In other words, the charge is divided into the first and second HCCD regions. When t is 10 or later, the charge is transmitted to the floating diffusion region by means of a clock signal of high applied to the gates on the HCCD region, such that the charge transmitted through the first HCCD region 23a is sensed to be outputted to a periphery circuit. On the other hand, the charge transmitted through the second HCCD region 23b is drained to the reset drain region without sensing. At this time, the charge drained through the second HCCD region 23b without sensing, even though it is a portion of the total charge, is clipped in the image signal-processing step, so that there is no loss of the signal.

FIG. 2a depicts plots of two transfer functions that map voltage from photoelectric conversion regions, e.g., photodiodes, to an output signal. As will be discussed below, the output signal can come from the image pick-up device in the case of analog mapping, or can come from a digital signal processor in the case of digital map.

Figure 1:
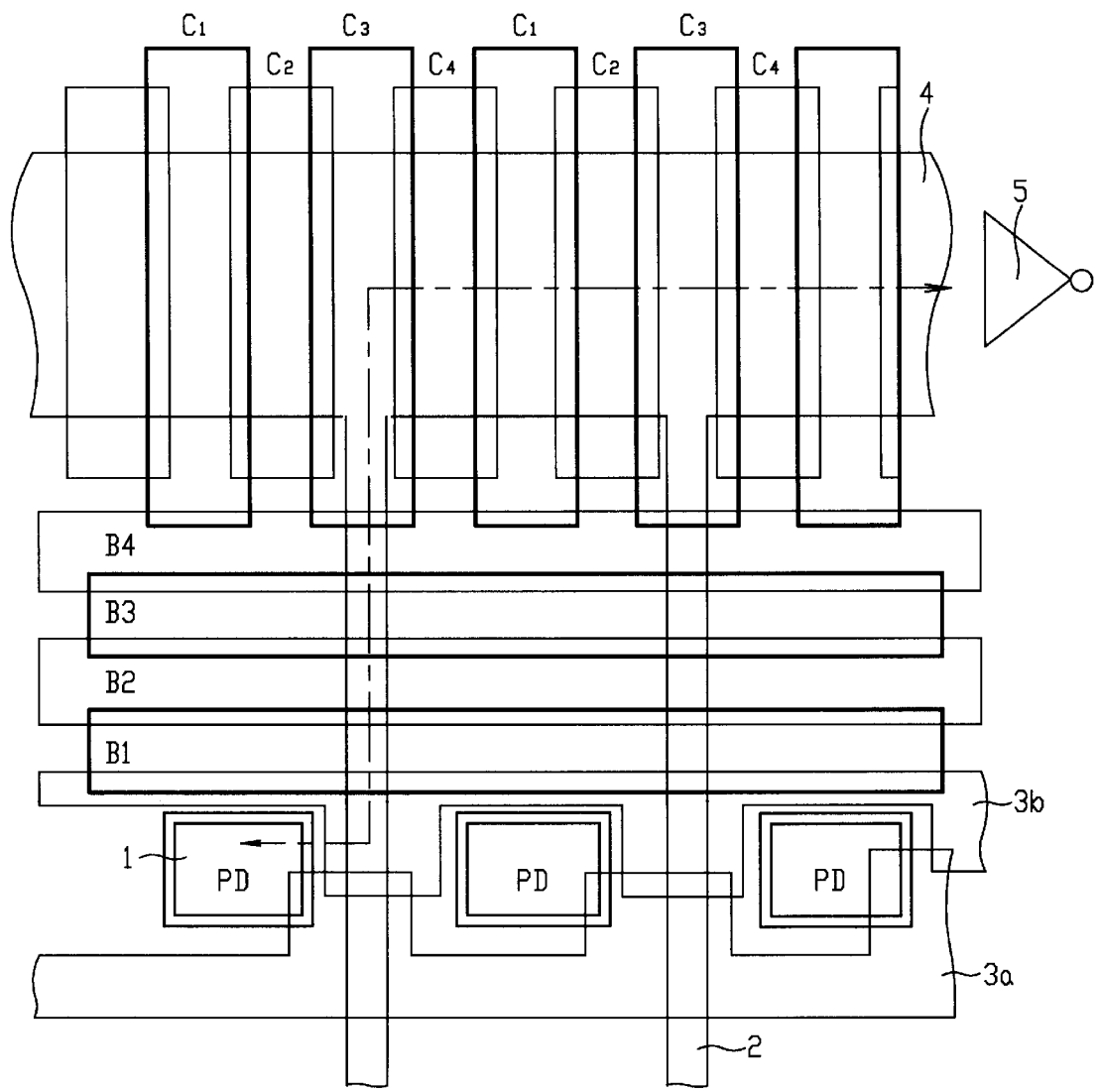
FIG. 1a is a layout of an output stage of a conventional solid state image pickup device.
FIG. 1b is a plot of conventional transfer functions.
Figure 1B:
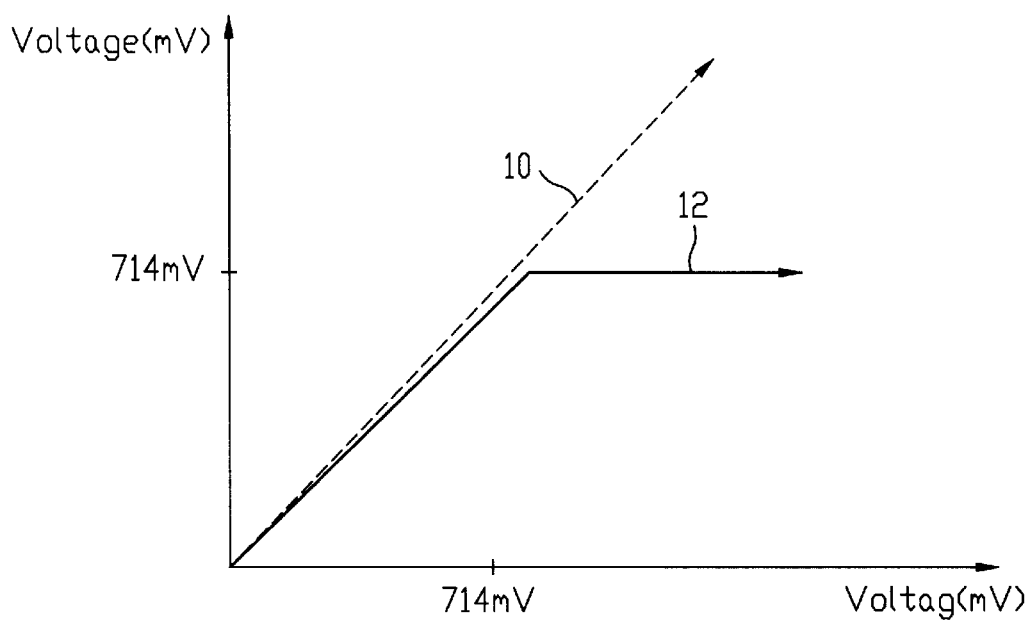

The first transfer function of FIG. 2a is depicted by the dashed line 14 and corresponds to the convention transfer function 12 of FIG. 1b. The second transfer function is depicted by the solid line invention. The transfer function 16 maps a range of values in excess of 0–714 mV onto a range of 0–714 mV. Here, the input range that is effectively mapped is zero to about 1200·1300 mV, with an upper bound of 1200 mV depicted in FIG. 2a.

The transfer function 16 of FIG. 2a maps 100% of the voltages from the photodiodes to an output signal for the range zero to 50% of the maximum output signal, i.e., 50%(714 mV)=357 mV. Between the 50% point and the maximum input value, here 1200 mV, the transfer function maps a fraction of the input signal. In the example of FIG. 2a, the transfer function 16 maps or attenuates by a factor of 0.6=714 mV/1200 mV.

A solid state image pickup device of the invention has the following advantages. it decrease signal charge of a high intensity of illumination by a predetermined rate and is outputted, so that a signal of a low or middle intensity of illumination has its intrinsic level, and a signal revised at a high intensity of illumination has a level which is not clipped in image signal-processing steps.

It will be apparent to those skilled in the art that various modification and variations can be made in the solid state image pickup device of the present invention without departing from the spirit or scope of the inventions. Thus, it is intended that the present invention cover the modifications and variations of this invention provided they come within the scope of the appended claims and their equivalents.

What is claimed is:

1. A solid image pickup device comprising:
   a plurality of photoelectric conversion regions;
   vertical charge coupled device (VCCD) regions for transferring in a vertical direction image charge generated in the photoelectric conversion regions;
   horizontal charge coupled device (HCCD) regions for dividing the image charge into one channel or two channel according to a level of the image charge transferred in a vertical direction and for transferring it in a horizontal direction; and,
   a floating diffusion region for sensing only the image charge transferred through any one of the channels of the HCCD regions and draining the image charge transferred through the other channel without sensing it.

2. The solid state image pickup device as claimed in claim 1, wherein first and second poly gates insulated from each other are repeatedly formed on the VCCD and HCCD regions and interfaces of the VCCD and HCCD regions.

3. The solid state image pickup device as claimed in claim 2, wherein any one of the first and second poly gates formed on the VCCD regions partially overlaps with the photoelectric conversion region.

4. The solid state image pickup device as claimed in claim 1, wherein a barrier gate is formed in a moving direction of the HCCD region at center under the first and second poly gates formed on the HCCD region.

5. The solid state image pickup device as claimed in claim 4, wherein when the image charge is transferred from the VCCD region to the HCCD region, a clock signal of high is applied to the barrier gate, and when it is finished to transfer the image charge to the HCCD region, a clock signal of low is applied to the barrier gate.

6. The solid state image pickup device as claimed in claim 5, wherein when the clock signal of low is applied to the barrier gate, a barrier layer is formed under the barrier gate, so that the HCCD region is divided into two channels.

7. The solid state image pickup device as claimed in claim 4, wherein a channel stop region is partially, repeated formed under the barrier gate so as to prevent the image charge from being transferred in a reverse direction.

8. The solid state image pickup device as claimed in claim 1, wherein a barrier layer is formed in any one of the two channels of the HCCD region, so that potential levels has step coverage.

9. The solid state image pickup device as claimed in claim 1, wherein when the image change transferred in a vertical direction is a signal of a low or middle intensity of illumination, among the two channels of the HCCD region, one channel to be sensed is used to transfer the charge, and when it is a signal of a high intensity of illumination, a predetermined portion of the image charge is left in the channel to be sensed and the rest of the image charge moves to the other channel not to be sensed.

\* \* \* \* \*